US006760901B2

(12) United States Patent
Bergman Reuter et al.

(10) Patent No.: US 6,760,901 B2
(45) Date of Patent: Jul. 6, 2004

(54) TROUGH ADJUSTED OPTICAL PROXIMITY CORRECTION FOR VIAS

(75) Inventors: Bette L. Bergman Reuter, Essex Junction, VT (US); Eric M. Coker, Burlington, VT (US); William C. Leipold, Enosburg Falls, VT (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 10/121,153

(22) Filed: Apr. 11, 2002

(65) Prior Publication Data

US 2003/0196178 A1 Oct. 16, 2003

(51) Int. Cl.[7] .......................... G06F 17/50; G06F 19/00; G03F 9/00
(52) U.S. Cl. .......................... 716/21; 700/110; 700/120; 700/121; 430/5; 378/35
(58) Field of Search .............................. 716/21; 430/5; 378/35; 700/110, 120, 121

(56) References Cited

U.S. PATENT DOCUMENTS

| | | | | |
|---|---|---|---|---|
| 5,705,301 A | * | 1/1998 | Garza et al. ................... | 430/5 |
| 5,723,233 A | * | 3/1998 | Garza et al. ................... | 430/5 |
| 5,879,844 A | | 3/1999 | Yamamoto et al. ............ | 430/30 |
| 5,994,009 A | | 11/1999 | Tzu et al. ...................... | 430/30 |
| 6,044,007 A | | 3/2000 | Capodieci ................... | 365/120 |
| 6,057,066 A | | 5/2000 | Hanawa ......................... | 430/5 |
| 6,077,310 A | | 6/2000 | Yamamoto et al. ............ | 716/19 |
| 6,548,224 B1 | * | 4/2003 | Chen et al. ................. | 430/314 |

FOREIGN PATENT DOCUMENTS

EP          288767 B1 * 12/1994  ........... H01B/13/20

OTHER PUBLICATIONS

NN8812286, "Defining Stepped Resist Structure Using E–Beam and Implemented with Proximity Correction", IBM Technical Disclosure Bulletin, vol. 31, No. 7, pp. 286–287 (4 pages).*

Whiteside et al., Effects of Photoresist Foreshortening on an Advanced Ti/ALCu/Ti Metallurgy and W Interconnect Technology 1998 IEEE/SEMI Advanced Semiconductor Manufacturing Conference and Workshop, Sep. 23, 1998, pp. 332–336.*

B.J. Lin, (Apr. 1985)"Depth–of–Focus Enhancement Using High Refractive Index Layer On The Imaging Layer", vol. 27 No. 11, p. 6521.

* cited by examiner

Primary Examiner—Matthew Smith
Assistant Examiner—Phallaka Kik
(74) Attorney, Agent, or Firm—Scully, Scott, Murphy & Presser; William D. Sabo, Esq.

(57) ABSTRACT

A trough adjusted optical proximity correction for vias which takes into account the topography on a wafer created by prior processing. The vias are classified into one of two groups, coincident vias which have an edge coincident with an edge of the trough, and noncoincident vias which do not have an edge coincident with an edge of the trough, by analyzing the via and trough designs. Any coincident via is marked as valid for an optical proximity correction (OPC). Any noncoincident via is marked invalid for OPC. OPC is then performed to the via level. Only vias marked as valid for OPC will keep the correction. All other vias will keep their original design size. Alternatively, coincident vias can be simply treated differently from noncoincident vias. For instance, coincident vias can be subjected to an aggressive OPC correction, while noncoincident vias are subjected to a less aggressive OPC correction.

20 Claims, 4 Drawing Sheets

TROUGH ADJUSTED OPTICAL PROXIMITY CORRECTION FOR VIAS

BACKGROUND OF THE INVENTION

1. Field of the Invention

The present invention relates generally to semiconductor chip manufacturing, in particular to vias, the electrical connections between successive wiring (metal) levels, and more particularly pertains to a trough adjusted optical proximity correction for dual damascene vias which takes into account the topography on a wafer created by prior wafer processing operations.

2. Discussion of the Prior Art

The via process window, for example for 0.25 $\mu$m or 0.18 $\mu$m or smaller silicon-device generations, is very small when using dual damascene integration. It is constrained by via opens in underexposed and/or negative focus conditions and via shorts in overexposed and/or positive focus conditions. The driving force behind the small via level process window is a severe topography caused by the metal level troughs. The process needs to be able to print isolated vias in very thick resist at the same time it prints densely populated or nested (e.g. an nxm array of) vias in very thin resist, as well as everything in between.

Standard optical proximity correction (OPC) examines both isolated vias and densely populated or nested (e.g. an nxm array of) vias, and ignores the topography of the wafer. The size of nested vias could be changed with a proximity correction algorithm to solve some of the problems in an attempt to make all vias print the same size. However, nested vias near the middle of a wide trough, such as bond pad vias, would also be corrected. This correction would cause the aerial image to degrade enough to make the nested vias in a wide trough disappear because they are already degraded by a focus offset induced by being in a wide trough. In other words, one problem would be fixed and another problem would be created. Since this approach is design dependent, OPC might work on one design, but not on another design.

SUMMARY OF THE INVENTION

Accordingly, it is a primary object of the present invention to provide a trough adjusted optical proximity correction for vias which takes into account the topography on a wafer created by prior wafer processing operations, and which is applicable to all types of processes wherein a via is printed over a severe topography.

In the dual damascene process, troughs are etched into an insulating layer which can be any type of dielectric layer including an oxide layer. Vias are then printed in the troughs using photolithography. The resist used for the via lithography is not planar. It partially conforms to the topography of the wafer. This conformity of the resist to the trough topography results in the creation of many different categories of vias which do not all print with the same size, even though they are designed to be the same size. The present invention provides an optical proximity correction which takes into account the topography on a wafer created by prior wafer processing operations.

The proximity correction eliminates or reduces the possibility of nested vias in a thin resist area becoming too large and causing shorts. The adjustment of the shapes and sizes of vias pursuant to the trough adjustment of the present invention can remove or adjust the proximity correction where there is no concern for shorts and where the proximity correction could actually cause another problem. In some cases in which there is no concern about shorts, making the vias smaller in design might degrade the aerial image enough to possibly cause a via open (scummed via in resist), and hence is not a solution to the problem.

The present invention provides a solution to the via process window problem, and provides a trough adjusted optical proximity correction for vias which takes into account the topography on a wafer created by prior processing. The vias are classified into one of two groups by analyzing the via and trough designs. Coincident vias are vias which have an edge coincident with or within a specified distance of an edge of a trough, and noncoincident vias do not have an edge coincident with or within a specified distance of an edge of the trough. Any coincident via is marked as valid for an optical proximity correction (OPC).

Any noncoincident via is marked as invalid for OPC. OPC is then performed to the via level. Only vias marked as valid for OPC will keep the correction. All other vias will keep their original design size. Alternatively, coincident vias can be simply treated differently from noncoincident vias. For instance, coincident vias can be subjected to an aggressive OPC correction, while noncoincident vias are subjected to a less aggressive OPC correction.

The present invention simply makes the vias which could cause a catastrophic failure (shorts) no longer a problem, and is more reliable and effective than the prior art.

BRIEF DESCRIPTION OF THE DRAWINGS

The foregoing objects and advantages of the present invention for a trough adjusted optical proximity correction for vias may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE DRAWINGS

Definitions

Vx=Any via level processed by means of the dual damascene process (x=as many levels as desired, e.g. =1, 2, 3, 4, . . . n).

Mx+1=Metal level above Vx in design on the etched wafer. A trough level Mx+1 is printed and etched, the wafer is recoated with photoresist, and then via level Vx, which connects metal levels Mx and Mx+1, is printed.

Coincident Edge=If in the design data, a via level Vx edge falls on or within a specified distance of a metal level Mx+1 edge.

Coincident Via=A via level Vx with a coincident edge to a metal level Mx+1.

Noncoincident Via=A via level Vx without a coincident edge to a metal level Mx+1.

Optical Proximity Correction (OPC)=Adjusting a via shape and/or size to account for neighboring shapes on the same data level with the purpose of making all shapes the desired size on the wafer.

TAOPC=Trough Adjusted OPC.

Bond Pad Via=Via in a very wide trough. Resist thinning causes this via to be very large nominally, however it drops off precipitously with a negative focus shift since the thin resist causes it to already be closer to an out-of-focus condition relative to other vias.

Description of Trough Adjusted OPC Algorithm

Figure 2:
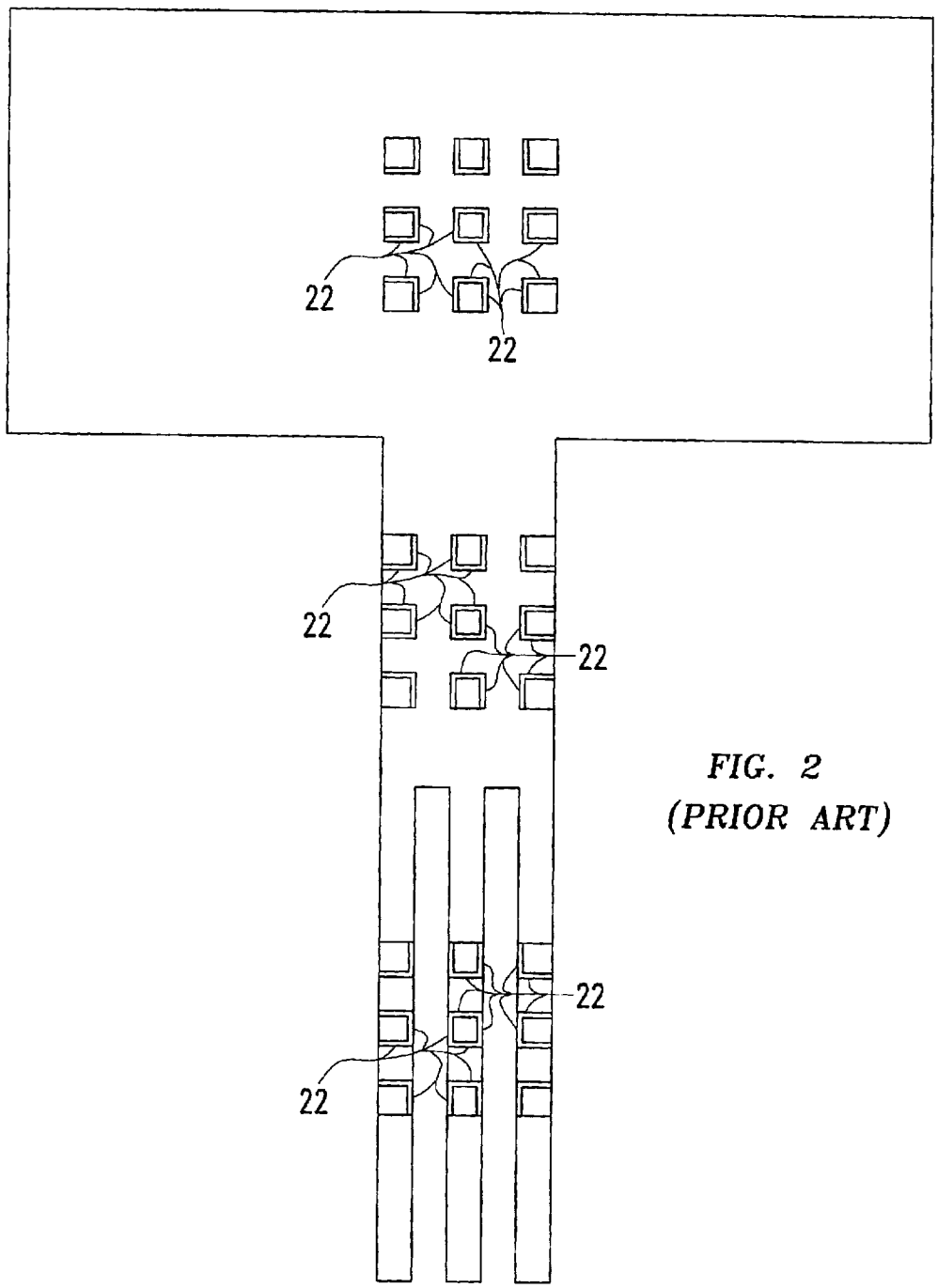
FIG. 2 illustrates the design of the metal level trough after conventional OPC processing, wherein each via face which is adjacent to another via face in a nested array of vias has received an OPC correction.
Figure 3:
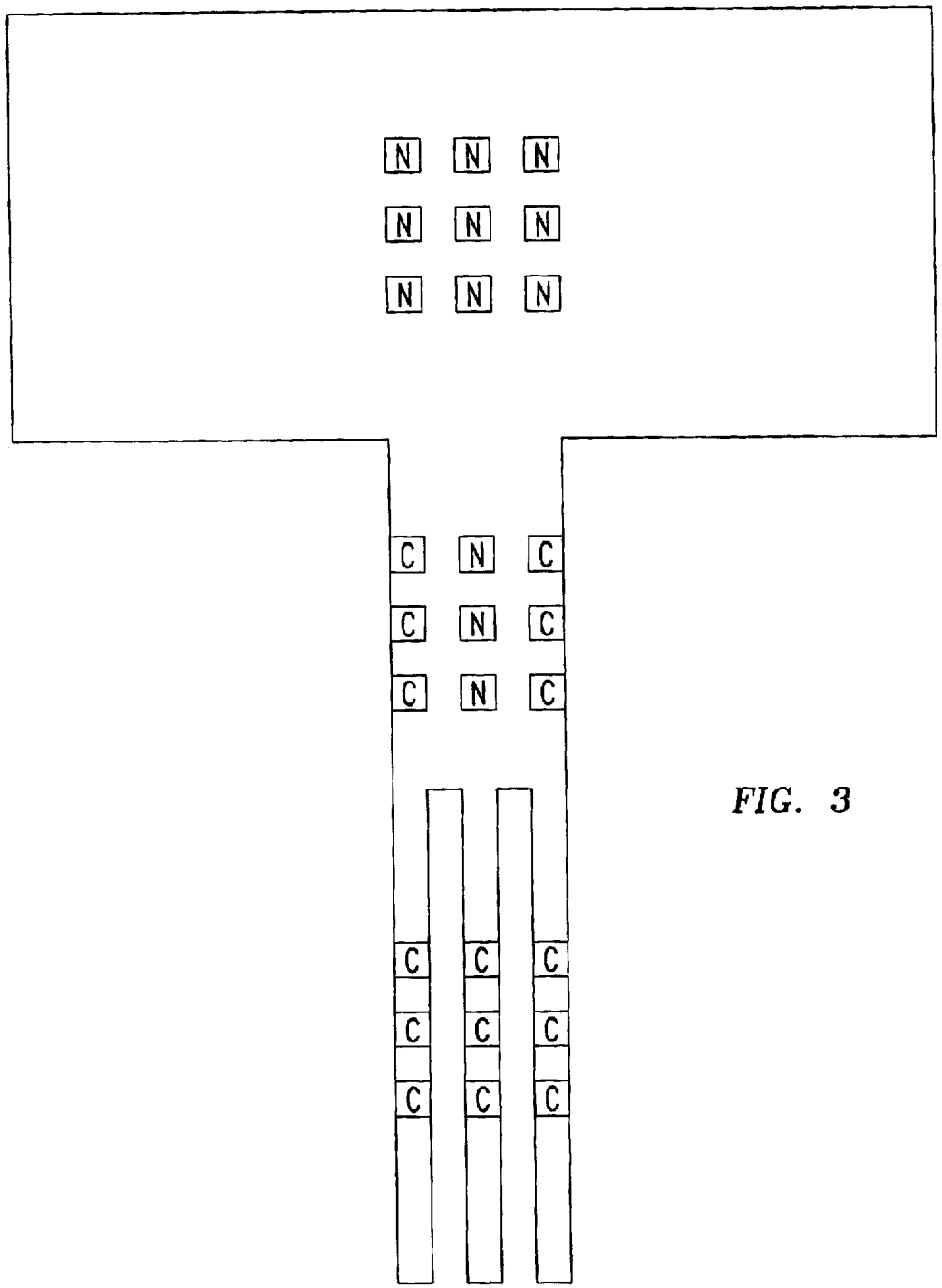
FIG. 3 illustrates the results of a coincidence edge check pursuant to the present invention wherein each coincident edge via is marked with a C, and each noncoincident edge via is marked with an N.

As illustrated in FIG. 3, the vias are classified into one of two groups, coincident vias and noncoincident vias, by analyzing the via level and metal level designs. Any coincident via is marked as valid for OPC. Any noncoincident via is marked invalid for OPC. OPC is then performed to the via level, as illustrated in FIG. 2. All vias are used as context in which to do a proximity correction. Any via edge with a neighboring via edge closer than a predetermined separation and with a common run length of greater than or equal to a predetermined value will be changed so as to adjust, reduce or possibly increase the size of the via by an amount chosen to provide the greatest depth of focus for the printing process. The edges of coincident edge vias which face neighboring vias within a given distance are adjusted to make the dimensions of the coincident edge vias optimal, either smaller or larger. Only vias marked as valid for OPC will keep the change. All others will keep their original design size.

EXAMPLES

The example below shows how this algorithm would affect a trough with three different 3×3 arrays of minimum pitch nested vias (Vx level) with different underlying topography (Mx+1).

Figure 1:
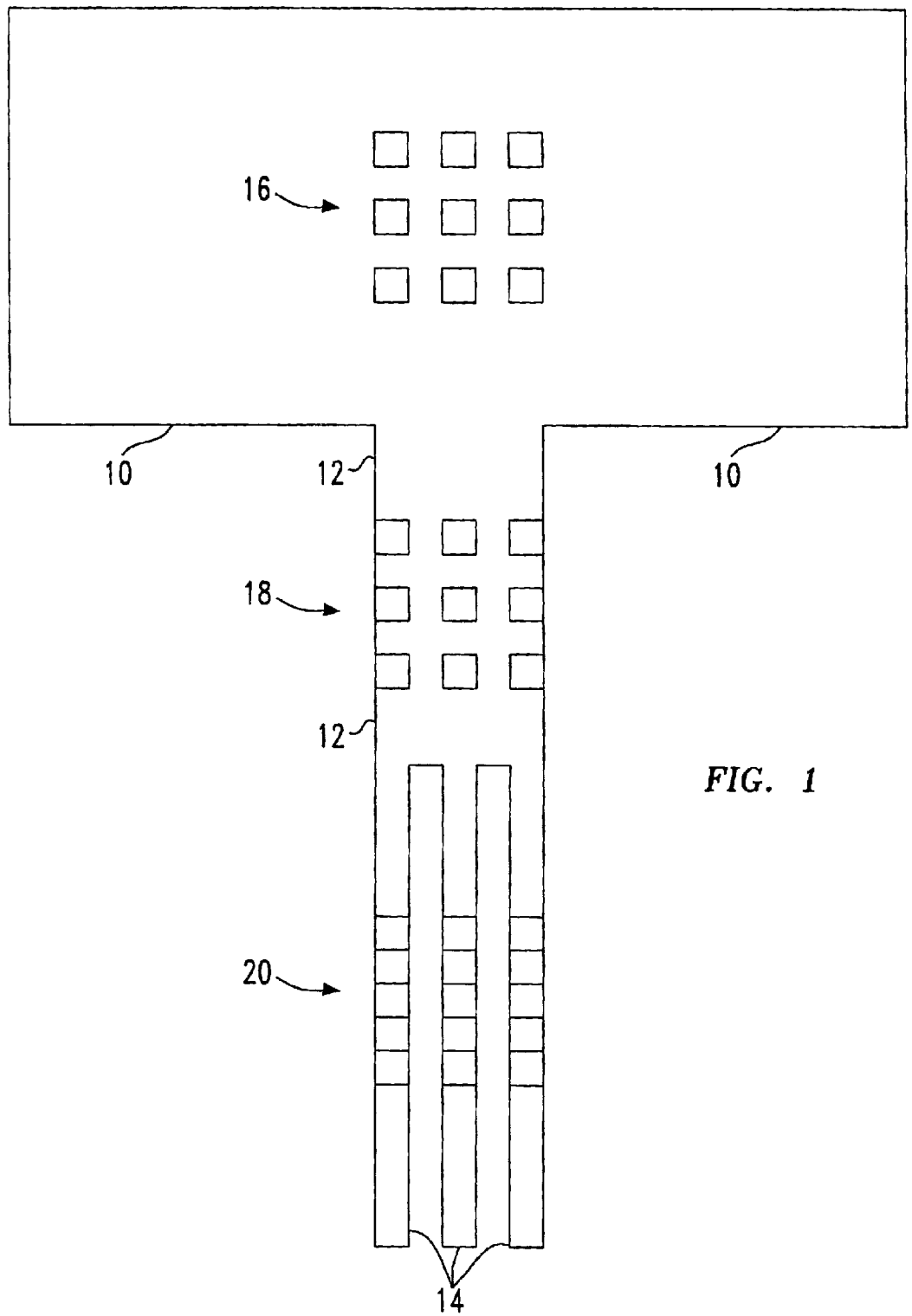
FIG. 1 illustrates an original design for a dual damascene layer of a semiconductor wafer having a generally T shaped metal level trough, and illustrates the original design of the metal level trough and vias before optical proximity correction (OPC) processing.

FIG. 1 illustrates an original design for a dual damascene layer of a semiconductor wafer having a generally T shaped Mx+1 trough, formed with a horizontally extending top 10 and a vertically extending base 12 having three separate vertically extending legs 14 formed at the base of the T. The Mx+1 trough is etched into the semiconductor wafer in a known manner in the dual damascene process. Three 3×3 arrays of nested vias extend into the trough, with the top 3×3 array 16 being bond pad vias formed in the center of a wide trough of the T, the middle 3×3 array 18 being formed near the top of the base of the T, with the left and right columns on one edge of the Mx+1 trough respectively, and the bottom 3×3 array 20 being formed near the bottom of the base of the T, with each column being on one of the three vertically extending legs, such that each column falls on two edges of the Mx+1 trough.

The shape of the Mx+1 trough is illustrative of many other different shapes of troughs in a typical semiconductor wafer.

FIG. 1 illustrates the original design of the Mx+1 trough and vias before optical proximity correction (OPC) processing wherein all of the vias have an original design size and a minimum separation between adjacent vias.

FIG. 2 illustrates the design of the Mx+1 trough after conventional OPC processing, wherein each via face in a 3×3 array which is adjacent to another via face in the array has received an OPC correction as indicated at 22.

FIG. 3 illustrates the results of a coincidence edge check pursuant to the present invention wherein each coincident edge via is marked with a C, and each noncoincident edge via is marked with an N.

Figure 4:
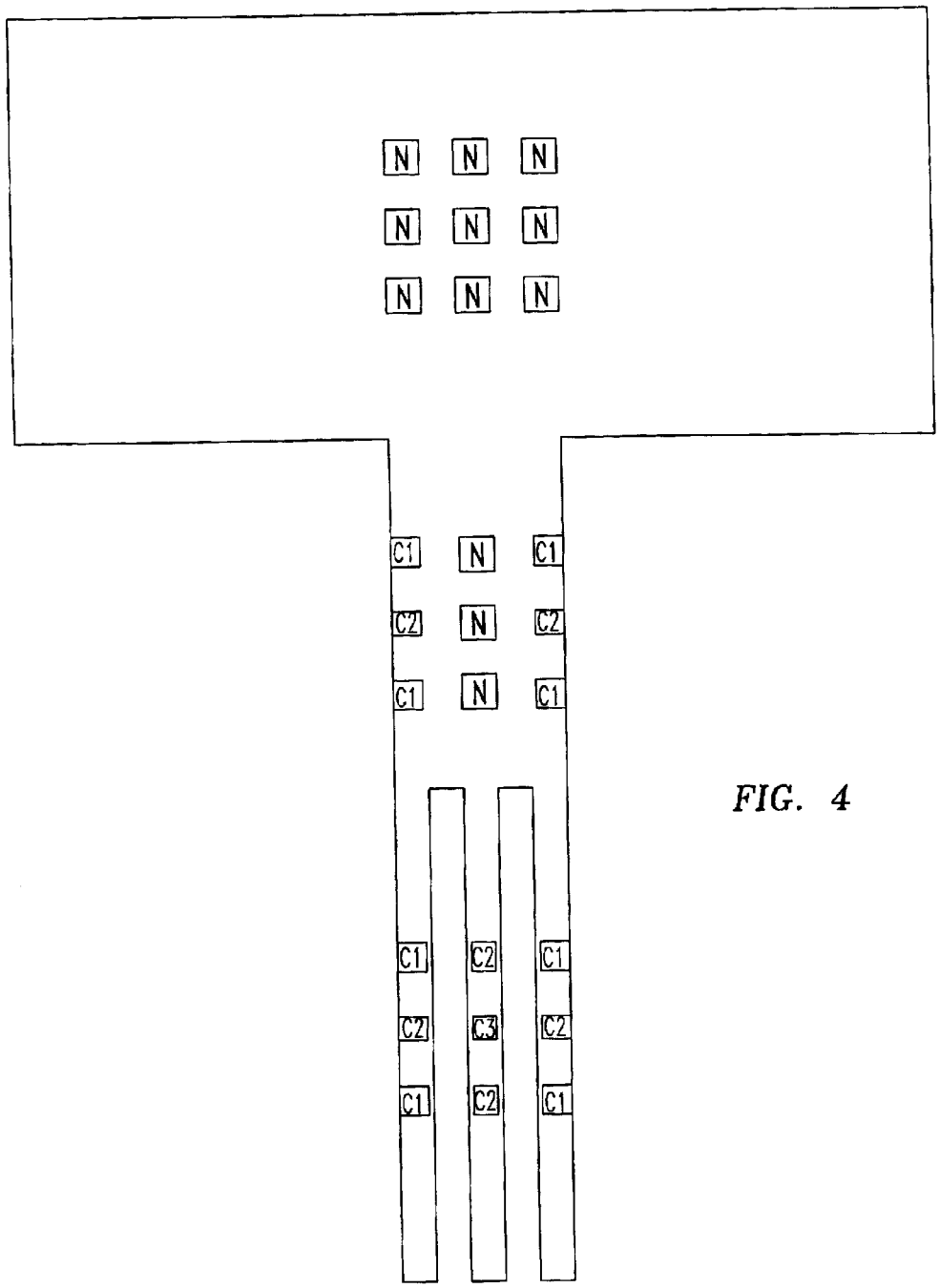
FIG. 4 illustrates the design of the metal level trough after processing pursuant to the present invention, wherein the OPC correction has been removed from those vias not having a coincident edge.

FIG. 4 illustrates the design of the Mx+1 trough after processing pursuant to the present invention, wherein no OPC correction has been applied to those vias not having a coincident edge, such that the N vias retain their original design size, the C1 vias have been corrected on two edges, the C2 vias have been corrected on three edges, and the C3 vias have been corrected on all four edges.

In the previous embodiment, only vias marked as valid for OPC keep the reduction, while all other vias keep their original design size.

In an alternative embodiment, coincident vias can be simply treated differently from noncoincident vias. For instance coincident vias can be subjected to an aggressive OPC correction, while noncoincident vias are subjected to a less aggressive OPC correction.

The present invention provides a solution to the via process window problem by making vias which could cause a catastrophic failure (shorts) no longer a problem, and is more reliable and effective than the prior art.

While several embodiments and variations of the present invention for a trough adjusted optical proximity correction for vias are described in detail herein, it should be apparent that the disclosure and teachings of the present invention will suggest many alternative designs to those skilled in the art.

Having thus described our invention, what we claim as new and desire to secure by Letters Patent is:

1. A method for adjusting sizes and shapes of vias in a semiconductor wafer, comprising:

classifying vias in a trough as vias having a coincident edge with or within a specified distance of an edge of the trough and vias not having a coincident edge with or within a specified distance of an edge of the trough;

adjusting vias which have a coincident edge with an optical proximity correction which is different from an optical proximity correction for vias not having a coincident edge.

2. The method of claim 1, performed in a dual damascene semiconductor wafer production process.

3. The method of claim 2, wherein the dual damascene process utilizes a dielectric insulator.

4. The method of claim 2, wherein the dual damascene process utilizes an oxide insulator.

5. The method of claim 4, wherein the coincident edge vias have two edges corrected.

6. The method of claim 4, wherein the coincident edge vias have three edges corrected.

7. The method of claim 4, wherein the coincident edge vias have four edges corrected.

8. The method of claim 2, wherein the coincident edge is coincident to a metal level above a via level.

9. The method of claim 1, wherein edges of coincident edge vias which face neighboring vias within a given distance are adjusted to change dimensions of the coincident edge vias.

10. The method of claim 1, wherein the edges of coincident edge vias which face neighboring vias within a given distance are adjusted to make the dimensions of the coincident edge vias smaller.

11. A method for adjusting sizes and shapes of vias in a semiconductor wafer, comprising:

classifying vias in a trough as vias having a coincident edge with or within a specified distance of an edge of the trough and vias not having a coincident edge with or within a specified distance of an edge of the trough;

adjusting with an optical proximity correction only those vias which have a coincident edge.

12. The method of claim 11, performed in a dual damascene semiconductor wafer production process.

13. The method of claim 12, wherein the dual damascene process utilizes a dielectric insulator.

14. The method of claim 12, wherein the dual damascene process utilizes an oxide insulator.

15. The method of claim 14, wherein the coincident edge vias have two edges corrected.

16. The method of claim 14, wherein the coincident edge vias have three edges corrected.

17. The method of claim 14, wherein the coincident edge vias have four edges corrected.

18. The method of claim 12, wherein the coincident edge is coincident to a metal level above a via level.

19. The method of claim 11, wherein edges of coincident edge vias which face neighboring vias within a given distance are adjusted to change dimensions of the coincident edge vias.

20. The method of claim 11, wherein edges of coincident edge vias which face neighboring vias within a given distance are adjusted to make dimensions of the coincident edge vias smaller.

* * * * *